United States Patent

Fukazawa et al.

[11] Patent Number: 5,810,940
[45] Date of Patent: Sep. 22, 1998

[54] METHOD FOR CLEANING SEMICONDUCTOR WAFERS

[75] Inventors: Yuji Fukazawa, Yokohama; Takahito Nakajima, Tokorozawa; Kazuhiko Takase, Kawasaki, all of Japan

[73] Assignee: Kabushiki Kaisha Toshiba, Kawasaki, Japan

[21] Appl. No.: 710,400

[22] Filed: Sep. 17, 1996

Related U.S. Application Data

[63] Continuation of Ser. No. 904,361, Jun. 26, 1992, abandoned.

[30] Foreign Application Priority Data

Jun. 28, 1991 [JP] Japan .................................. 3-158598
Jun. 23, 1992 [JP] Japan .................................. 4-164967

[51] Int. Cl.[6] .................................................. C03C 23/00
[52] U.S. Cl. .................................. 134/3; 134/2; 134/26; 134/28; 134/902
[58] Field of Search .......................... 134/902, 2, 1.1, 134/1.2, 1.3, 1, 26, 28, 29, 25.1, 18, 3

[56] References Cited

U.S. PATENT DOCUMENTS

| | | | |
|---|---|---|---|
| 4,577,650 | 3/1986 | McConnell | 134/59 |
| 4,778,532 | 10/1988 | McConnell et al. | 134/10 |
| 4,795,497 | 1/1989 | McConnell et al. | 134/18 |
| 4,997,490 | 3/1991 | Vetter et al. | 134/95.1 |
| 5,470,393 | 11/1995 | Fukazawa | 134/26 |

OTHER PUBLICATIONS

Werner Kern and David A. Puotinen, Cleaning Solutions Based on Hydrogen Peroxide for use in Silicon Semiconductor Technology, RCA Review Jun. 1970, pp. 187–205.

Alan E. Walter and Christopher F. McConnell, Direct Displacement Wet Processing: How it Affects Wafer Surface Phenomena, Microcontamination, Jan. 1990, pp. 35–38 and 60–61.

*Primary Examiner*—Jill Warden
*Assistant Examiner*—Alexander Markoff
*Attorney, Agent, or Firm*—Finnegan, Henderson, Farabow, Garrett & Dunner, L.L.P.

[57] ABSTRACT

For cleaning a semiconductor wafer without exposing it to the atmosphere, after the semiconductor wafer is placed in a cleaning vessel which is filled with deionized water through a first control valve, a first cleaning fluid is supplied to the cleaning vessel through a second control valve so that the deionized water overflows. A second cleaning fluid is then supplied to the vessel through a third control valve such that the first cleaning fluid overflows to produce a mixed fluid containing the first cleaning fluid, thereby cleaning the semiconductor wafer therein.

28 Claims, 5 Drawing Sheets

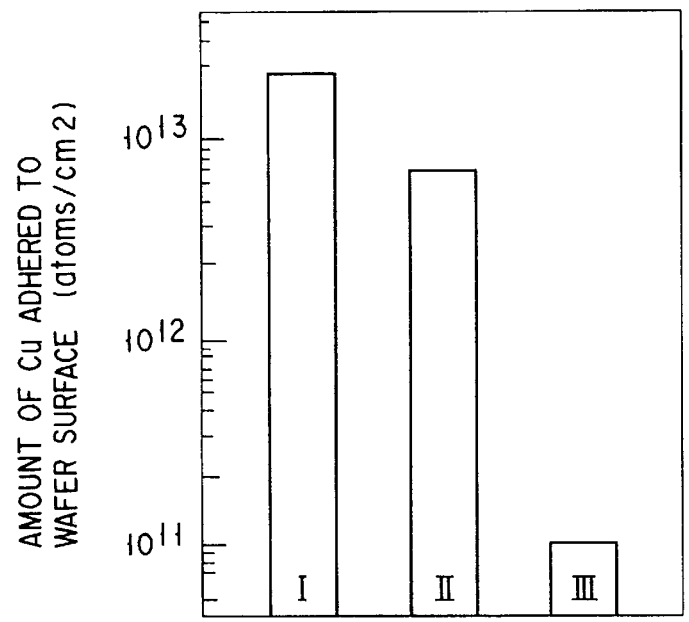
F I G. 3
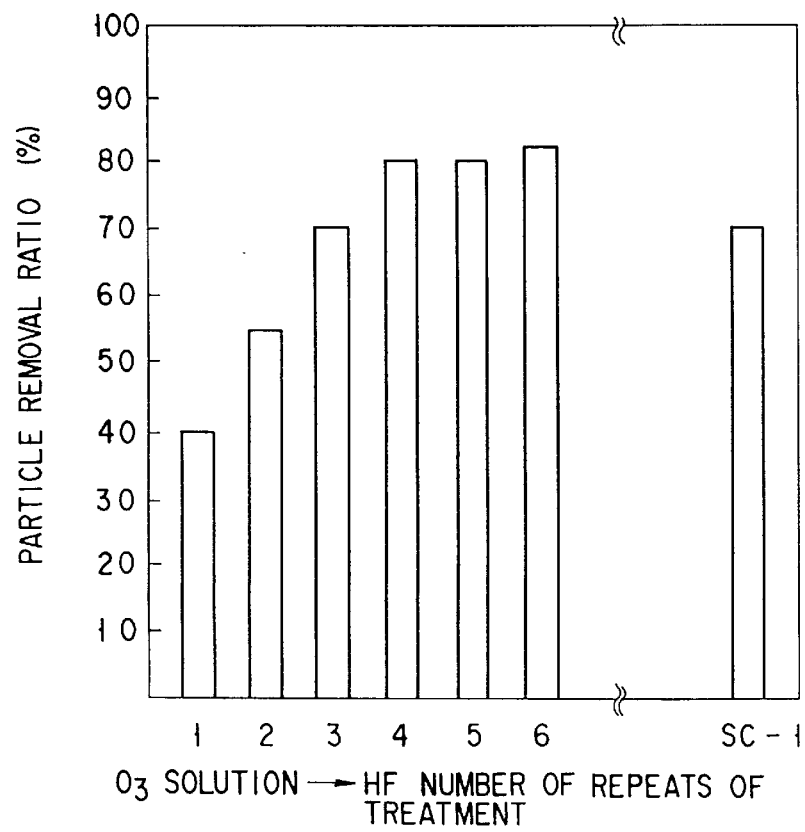
F I G. 4

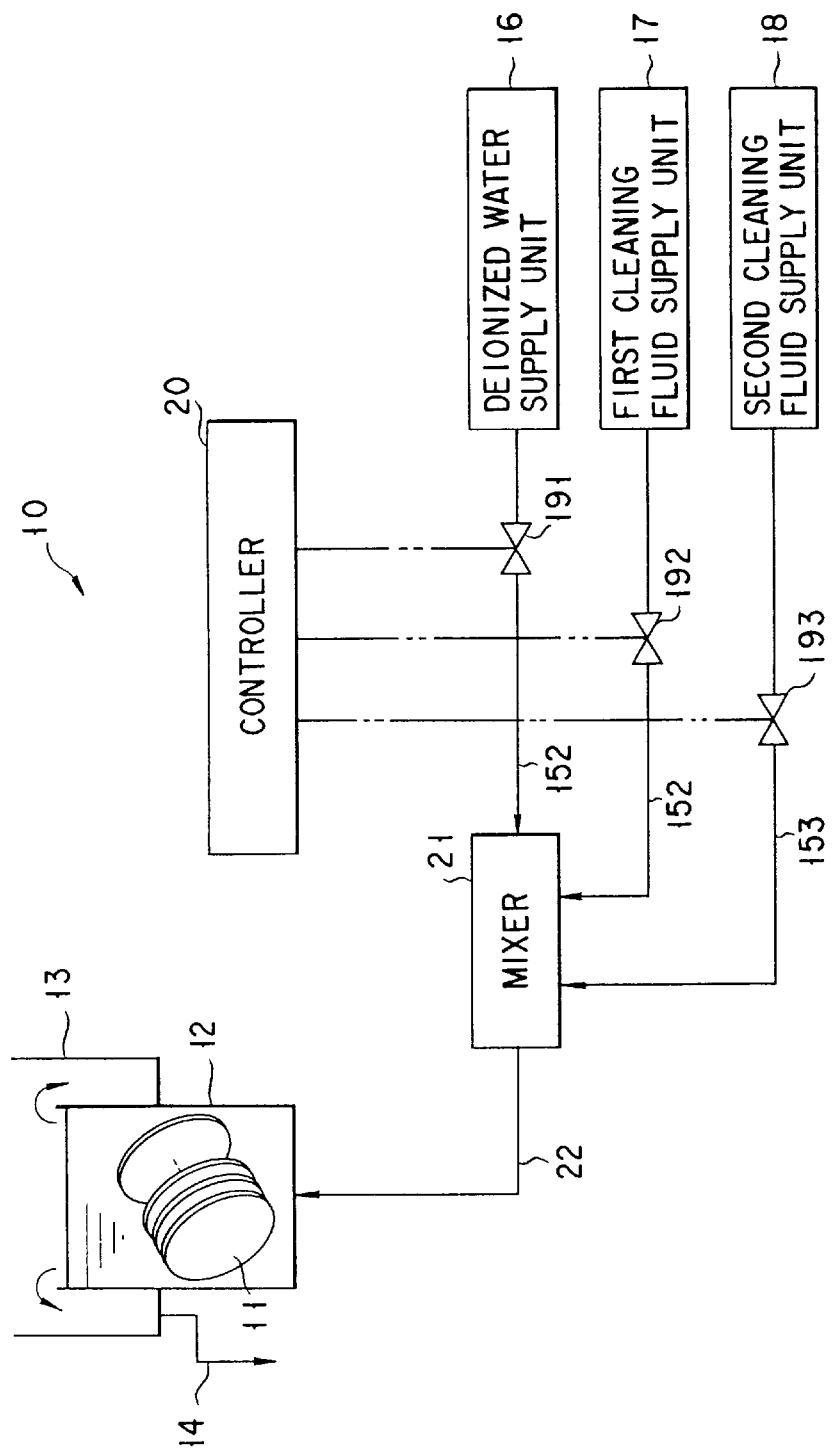
F I G. 5

METHOD FOR CLEANING SEMICONDUCTOR WAFERS

This application is a continuation application Ser. No. 07/904,361, filed Jun. 26, 1992, now abandoned.

BACKGROUND OF THE INVENTION

1. Field of the Invention

The present invention relates generally to a method and apparatus for cleaning a semiconductor wafer, and more particularly to a method and apparatus for effectively removing unwanted impurities or particles from a wafer surface.

2. Description of the Related Art

Conventionally, a silicon wafer is basically cleaned by an RCA cleaning technique. The RCA cleaning includes an SC-2 treatment. The SC-2 treatment is intended to remove metals such as iron (Fe), aluminum (Al), and copper (Cu) from the wafer surface. The following is the sequence of the SC-2 treatment:

(a) A silicon wafer is immersed into a dilute hydrofluoric acid solution for a predetermined period of time.

(b) The wafer is rinsed with deionized water.

(c) The wafer is immersed into the SC-2 solution ($HCl:H_2O_2:H_2O=1:1:6$ by volume ratio) for a predetermined period of time, for example, 10 minutes at a temperature of about 80° C.

(d) The wafer is rinsed with deionized water.

(e) The wafer is dried by centrifugal drying or IPA drying.

The RCA cleaning is disclosed in "Cleaning Solutions Based on Hydrogen Peroxide for Use in Silicon Semiconductor Technology", W Kern and David A Puotinen, RCA Review, June 1970, pp. 187 to 206.

FIG. 6 shows a system 50 of a conventional cleaning apparatus for performing the cleaning as described above, and FIG. 7 shows the cleaning process. In FIG. 6, necessary control valves are not depicted.

As shown in FIG. 6, hydrofluoric acid (HF) stored in a reservoir 511 and deionized water stored in a reservoir 512 are mixed in a mixer 521, thereby producing a dilute hydrofluoric acid solution. The dilute hydrofluoric acid solution is stored in a first cleaning vessel 531. Wafers 54 are immersed into the first cleaning vessel 531 to carry out the above step (a).

A second cleaning vessel 532 is filled with deionized water. After the first step (a), as indicated by an arrow A shown in FIG. 7, the wafers are transferred to a second cleaning vessel 532 to accomplish the above step (b).

A third cleaning vessel 533 is filled with an SC-2 solution. The SC-2 solution is obtained by mixing, in a mixer 522, hydrochloric acid (HCl) stored in a reservoir 513, hydrogen peroxide solution ($H_2O_2$) stored in a reservoir 514, and deionized water stored in a reservoir 515. Then, as indicated by an arrow B in FIG. 7, the wafers are transferred from the second cleaning vessel 532 to the third cleaning vessel 533, thereby performing the above step (c), i.e., the treatment of the SC-2 solution. Thereafter, as indicated by an arrow C in FIG. 7, the wafers are transferred to a fourth cleaning vessel 534 filled with deionized water, thereby carrying out the above step (d). Subsequently, as indicated by an arrow D in FIG. 7, the wafers 54 are withdrawn from the fourth cleaning vessel 534 and dried in the above step (e).

However, in the cleaning system 50 as described above, the four vessels 531 to 534 are required to perform the steps of (a) cleaning with the dilute hydrofluoric acid solution, (b) cleaning with the deionized water, (c) cleaning with the SC-2 solution, and (d) cleaning with the deionized water. Therefore, the apparatus becomes inevitably large. In addition, for producing the dilute hydrofluoric acid solution and the SC-2 solution, the reservoirs 511 to 515 and the mixers 521 and 522 are required, resulting in a further large apparatus. The large size of the apparatus greatly influences the design or arrangement of a clean room and the like.

Moreover, through the above steps (a) to (d), wafers are transferred from one vessel to another. Hence, the wafers are exposed to the atmosphere many times, with the result that the cleaning effect of the wafers is decreased.

Further, it is difficult to remove heavy metals, particularly copper, by the SC-2 treatment of the RCA cleaning.

In a treatment of removing particles adhered to the wafer surface, called an SC-1 treatment, the surface of the silicon wafer is etched to remove particles by lift-off techniques. In this case, since the wafer surface is etched, the wafer tends to be damaged. In addition, the etching of the wafer depends on the crystal orientation. For example, silicon is etched in larger amount in the <100> orientation than in the <111> orientation. For this reason, if the wafer has crystal defects near the surface, the wafer cannot be uniformly etched.

As described above, since the conventional cleaning apparatus has a plurality of cleaning vessels, it becomes large, and since wafers are exposed to the atmosphere when they are withdrawn from one vessel and transferred to another vessel, the cleaning effect is reduced. Further, copper cannot be satisfactorily removed from the wafer in the SC-2 treatment of the conventional RCA cleaning method, and the wafer is also damaged in the SC-1 treatment.

SUMMARY OF THE INVENTION

Accordingly, an object of the present invention is to provide a novel method for cleaning a semiconductor wafer.

Another object of the present invention is to provide a method of cleaning a semiconductor wafer to remove metal impurities and particles from the wafer.

Still another object of the present invention is to provide an apparatus of cleaning a semiconductor wafer.

According to an aspect of the present invention, there is provided a method of cleaning a semiconductor wafer without exposing it to the atmosphere. After a semiconductor wafer is placed in a cleaning vessel filled with deionized water, a first cleaning fluid is supplied to the vessel so that the deionized water overflows. A second cleaning fluid is supplied to the vessel such that the first cleaning fluid overflows to produce a mixed fluid containing the first cleaning fluid, thereby cleaning the semiconductor wafer therein.

According to another aspect of the present invention, there is provided an apparatus for cleaning a semiconductor wafer according to the design incorporated in the first referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 3 is a diagram for explaining an effect of the surface treatment according to the present invention;

FIG. 4 is a diagram for explaining another effect of the surface treatment according to the present invention;

FIG. 5 is a schematic diagram showing an apparatus for cleaning a semiconductor wafer according to a second embodiment of the present invention;

DETAILED DESCRIPTION OF THE PREFERRED EMBODIMENTS

Figure 1:
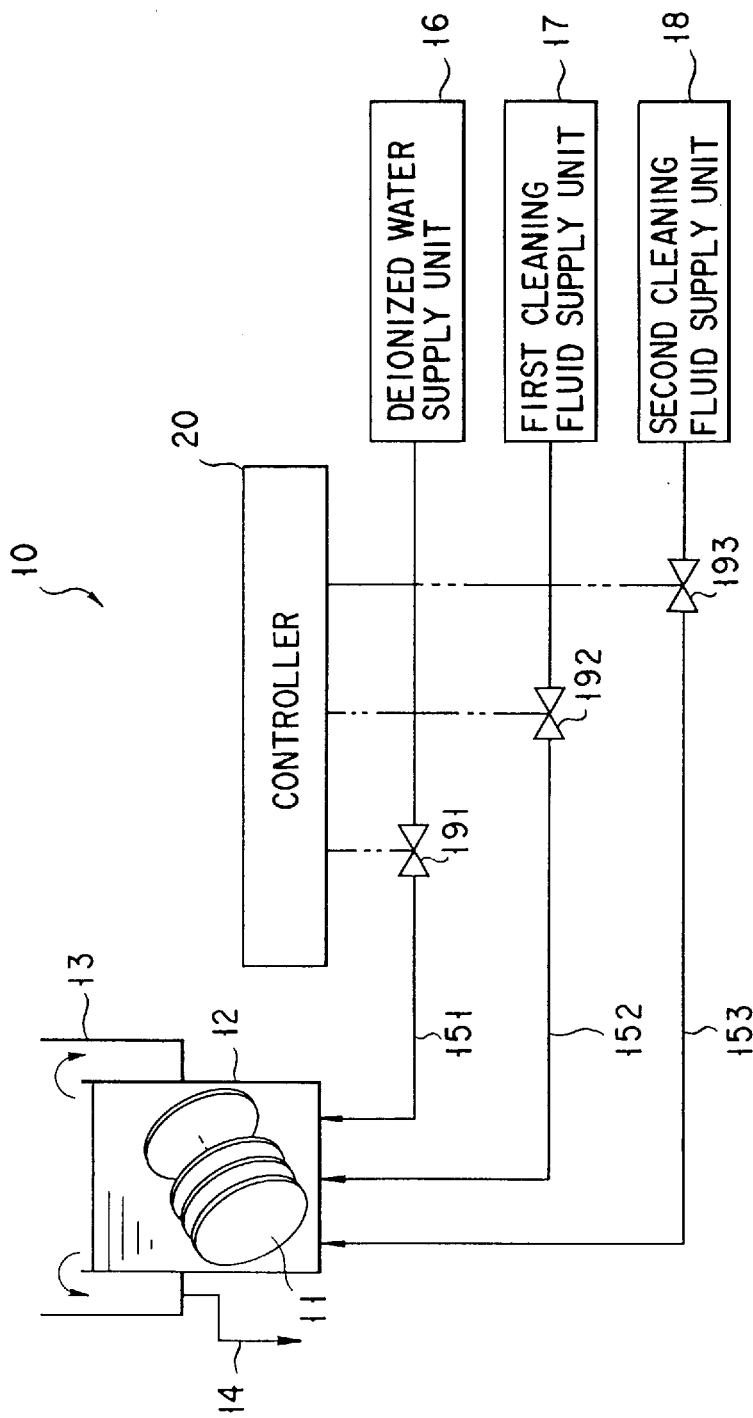
FIG. 1 is a schematic diagram showing an apparatus for cleaning a semiconductor wafer according to a first embodiment of the present invention.

Embodiments of the present invention will now be described with reference to the accompanying drawings.

In the following description, the portions common to two or more drawings are identified by the same reference numerals.

FIG. 1 shows an apparatus 10 for treating a surface of a semiconductor wafer according to an embodiment of the present invention.

As shown in FIG. 1, the apparatus 10 has a cleaning vessel 12 for treating semiconductor wafers 11. A drain member 13 for draining deionized water or a cleaning fluid which overflows the vessel 12 is provided around the vessel 12. A drain 14 is connected to the drain member 13. A deionized water supply unit 16, a first cleaning fluid supply unit 17, and a second cleaning fluid supply unit 18 are connected to the cleaning vessel 12 through supply lines 151, 152 and 153, respectively. Deionized water, a first cleaning fluid and a second cleaning fluid are successively supplied to the vessel 12 through control valves 191, 192 and 193, respectively. The control valves are controlled by a controller 20 in a manner as described below, thereby treating the surfaces of the semiconductor wafers 11 placed in the cleaning vessel 12.

EXAMPLE 1

It is described to treat the surfaces of the silicon wafers 11, using a dilute hydrofluoric acid solution and an ozone solution as the first and second cleaning fluids.

Figure 2A:
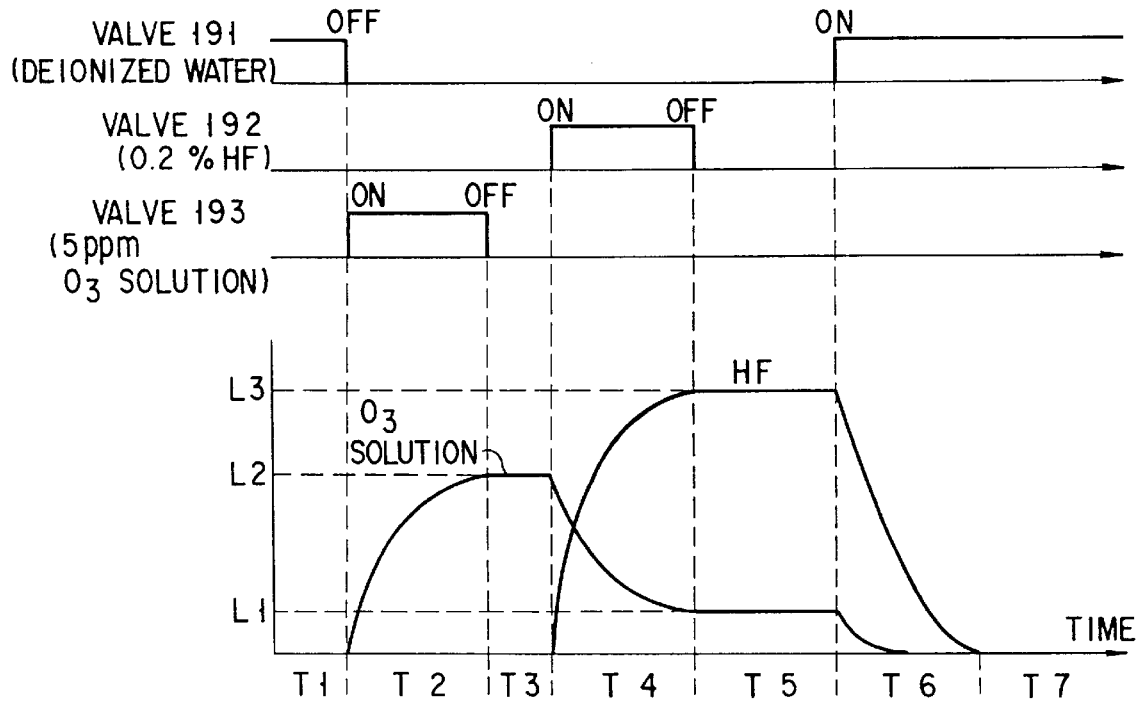
FIG. 2A is a diagram showing a relation between the time and the timing of supplying cleaning fluids and the concentration of cleaning fluids when a wafer is surface-treated.

FIG. 2A shows the relation between the time and the timing of supplying the cleaning fluids and the concentration of the cleaning fluids in treating the wafer surface when the deionized water, the hydrofluoric acid solution, and the ozone solution are supplied to the cleaning vessel 12 through the control valves 191 to 193 controlled by the controller 20.

The control valve 191 of the supply line 151 is turned on so that the deionized water is supplied to the cleaning vessel 12 from the deionized water supply unit 16 for a time period T1 at a flow rate of approximately 20 l per minute. As a result, the cleaning vessel 12 is filled with the deionized water and maintained clean by the overflow.

After the wafer 11 is placed in the cleaning vessel 12, the control valve 191 is turned off. At the same time, the control valve 193 is turned on so that the ozone solution of 5 ppm is supplied from the second cleaning fluid supply unit 18 to the cleaning vessel 12 for a time period T2 at a flow rate of 1 l per minute. By the supply of the ozone solution, the deionized water overflows the cleaning vessel 12 and is gradually replaced by the ozone solution, thereby gradually increasing the concentration of the ozone solution in the cleaning vessel 12. For example, when the concentration of the ozone solution reaches 4 ppm (concentration level L2), the control valve 193 is turned off to stop supplying the ozone solution. This state is maintained for a time period T3, for example, three minutes. The wafer 11 is treated with the ozone solution during time periods T2 and T3. In the treatment, organic materials adsorbed to the wafer surface is decomposed by the ozone solution and removed therefrom.

In this case, when the wafer surface is exposed, the silicon surface may be oxidized to produce an oxide film having a thickness of 10 to 20 Å. The time periods T2 and T3 and the concentration level L2 of the ozone solution are determined by the level of the organic materials adsorbed to the wafer surface. Therefore, when the organic materials adsorbed to the wafer surface are removed within the time period T2, the period of time T3 may be omitted.

Thereafter, the control valve 192 of the supply line 152 is turned on so that 0.2 wt. % of dilute hydrofluoric acid solution is supplied to the cleaning vessel 12 from the first cleaning fluid supply unit 17 for a time period T4 at a flow rate of approximately 0.5 l per minute. By the supply of the dilute hydrofluoric acid solution, the ozone solution overflows the cleaning vessel 12, the concentration of the ozone solution in the cleaning vessel 12 is gradually decreased to a level L1, and the concentration of the dilute hydrofluoric acid solution is gradually increased to a level L3, thereby producing a mixture composed of the dilute hydrofluoric acid solution and the ozone solution. For example, when the concentration of the dilute hydrofluoric acid solution reaches approximately 0.1% (concentration level L3) and the concentration of the ozone solution reaches approximately 1 ppm (concentration level L1), the control valve 192 is turned off to stop supplying the dilute hydrofluoric acid solution. This state is maintained for a time period T5, for example, five minutes.

Subsequently, the control valve 191 is turned on, thereby replacing the mixture of the dilute hydrofluoric acid solution and the ozone solution, filled in the cleaning vessel 12, with the deionized water for a time period T6. Then, the wafer is rinsed for a time period T7. Thereafter, the wafer is taken from the cleaning vessel 12 and dried.

In the present invention, as described above, the oxide film formed by the ozone solution during the time period T2 to T3 is removed from the wafer surface during the time period T4 to T6 that is defined between the time when the dilute hydrofluoric acid solution begins to be supplied to cleaning vessel 12 (the time when the control valve 192 is turned on), i.e., the time when the mixture of the dilute hydrofluoric acid solution and the ozone solution is produced, and the time when the mixture is replaced with the deionized water. At the same time, metal impurities such as iron (Fe) and aluminum (At) adsorbed to the wafer surface are removed. In addition, since the mixture of the dilute hydrofluoric acid solution and the ozone solution exists in the cleaning vessel, copper, which cannot be removed by the hydrofluoric acid only, can be removed from the wafer surface during the time period T4 to T6.

In the above example, the oxide film formed by the ozone solution is removed by the dilute hydrofluoric acid. Further, even if particles produced in the wafer process are adhered to the wafer surface, they can be removed by the lift-off effect.

The time period T5 is optimized by the level of the metal contaminations such as Au and Cu. Therefore, when the metal impurities adhered to the wafer surface are removed within the time period T4, the time period T5 is not required, and the deionized water may be supplied just after the concentration of the dilute hydrofluoric acid solution reaches the level L3.

About 1 wt. % of hydrogen peroxide solution may be used instead of the ozone solution.

EXAMPLE 2

It is described to remove metal impurities such as iron (Fe), aluminum (Al), and copper (Cu) from the wafer surface, using the dilute hydrofluoric acid solution and a hydrogen peroxide solution as the first and second cleaning fluids.

Figure 2B:
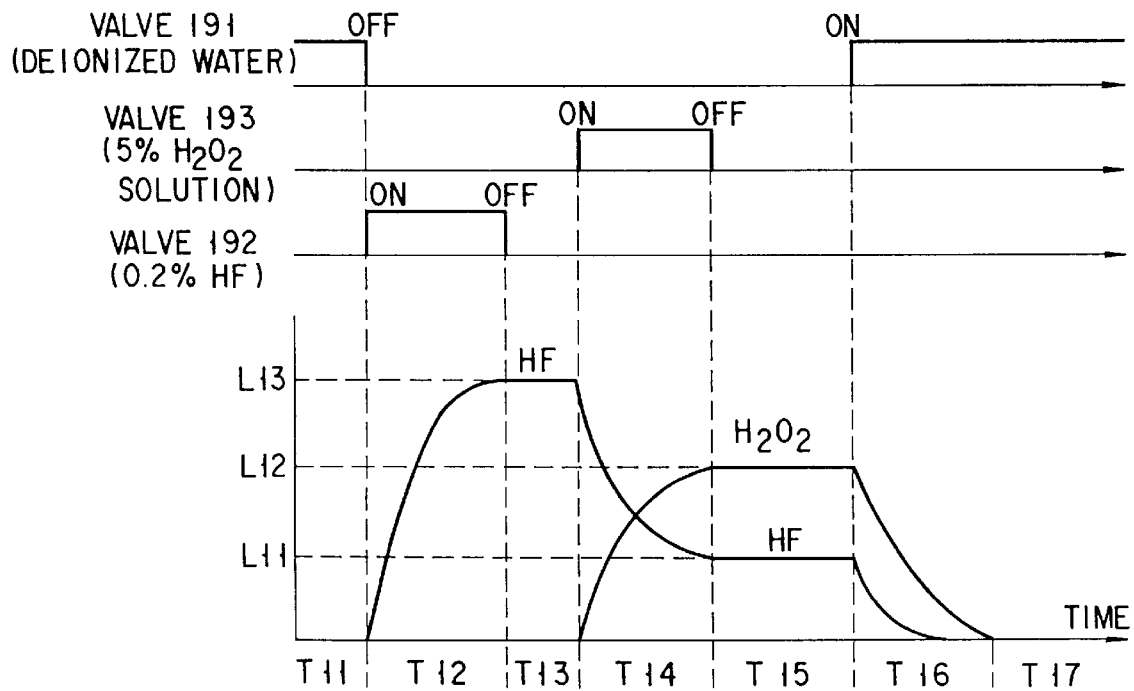
FIG. 2B is a diagram showing the relation between the time and the timing of supplying cleaning fluids and the concentration of the cleaning fluids when metal impurities are removed from the wafer surface.
Figure 6:
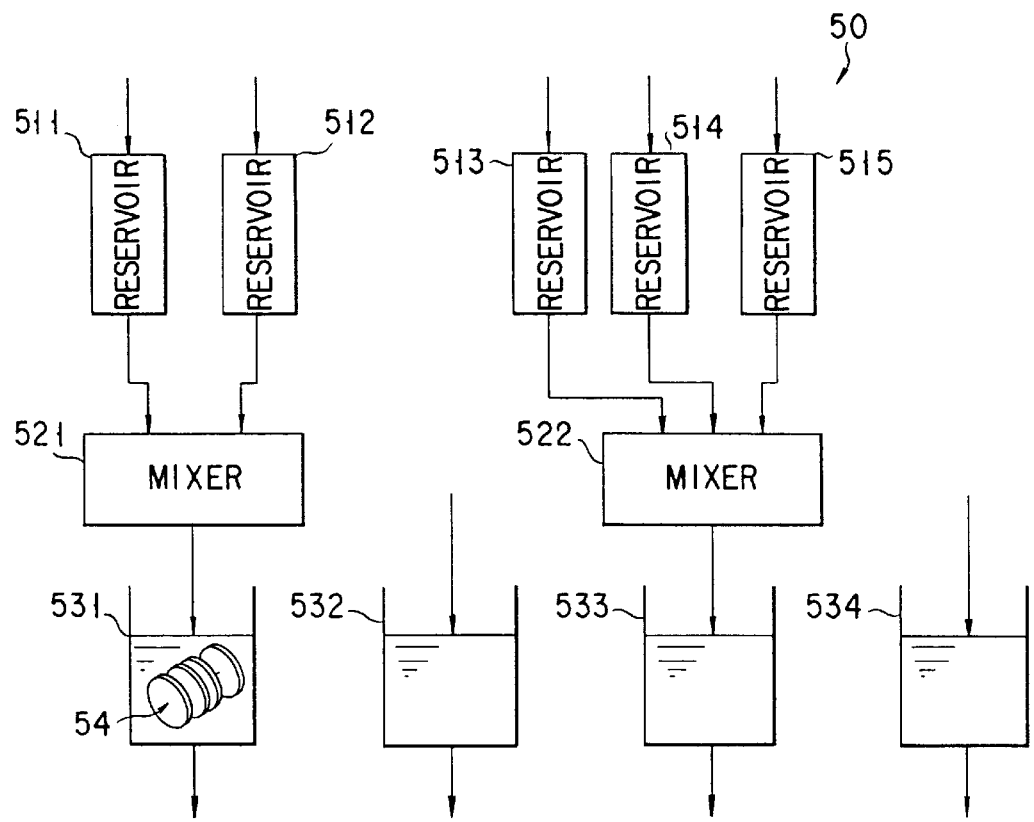
FIG. 6 is a schematic diagram showing a system of a conventional apparatus for cleaning a semiconductor wafer.
Figure 7:
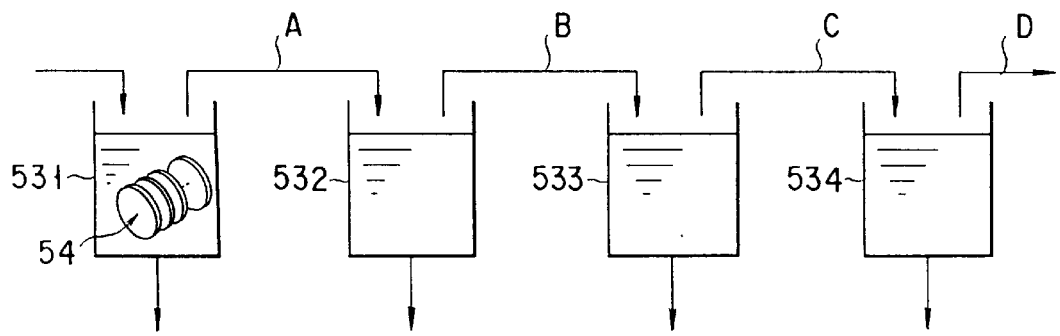
FIG. 7 is a diagram showing a treatment of cleaning a semiconductor wafer in the conventional cleaning apparatus.

FIG. 2B shows the relation between the time and the timing of supplying the cleaning fluids and the concentrations of the cleaning fluids when the metal impurities are removed.

The control valve 191 of the supply line 151 is turned on to supply the deionized water to the cleaning vessel 12 from the deionized water supply unit 16 for a time period T11. As a result, the cleaning vessel 12 is filled with the deionized water and maintained clean by the overflow.

After the wafer 11 is placed in the cleaning vessel 12, the control valve 191 is turned off. At the same time, the control valve 192 of the supply line 152 is turned on to supply 0.2 wt. % of dilute hydrofluoric acid solution to the cleaning vessel 12 from the first cleaning fluid supply unit 17 for a time period T12. By the supply of the dilute hydrofluoric acid solution, the deionized water overflows the cleaning vessel 12 and is gradually replaced by the dilute hydrofluoric acid solution, and the concentration of the dilute hydrofluoric acid solution in the cleaning vessel 12 is gradually increased. For example, when the concentration of the dilute hydrofluoric acid solution reaches 0.1% (concentration level L13), the control valve 192 is turned off to stop supplying the dilute hydrofluoric acid solution. This state is maintained for a time period T13.

Thereafter, the control valve 193 of the supply line 153 is turned on to supply 5 wt. % of hydrogen peroxide solution to the cleaning vessel 12 from the second cleaning fluid supply unit 18 for a time period T14. By the supply of the hydrogen peroxide solution, the dilute hydrofluoric acid solution overflows the cleaning vessel 12, the concentration of the dilute hydrofluoric acid solution in the cleaning vessel 12 is gradually decreased to 0.05% (concentration level L11), and the concentration of the hydrogen peroxide solution is gradually increased to 2% (concentration level L12), thereby producing a mixture composed of the hydrogen peroxide solution and the dilute hydrofluoric acid solution. When the concentration of the hydrogen peroxide solution reaches the level L12 and the concentration of the dilute hydrofluoric acid solution reaches the level L11, the control valve 193 is turned off to stop supplying the hydrogen peroxide solution. This state is maintained for a time period T15.

Subsequently, the control valve 191 is turned on thereby replacing the mixture by the deionized water for a time period T16. Then, the wafer is rinsed for a time period T17. Thereafter, the wafer is taken out from the cleaning vessel 12 and dried.

The following shows advantages of cleaning the wafer by continuously changing the concentration of the mixture, composed of the dilute hydrofluoric acid solution and the hydrogen peroxide solution, in only the cleaning vessel 12.

For example, when a mixture composed of 0.05 wt. % of dilute hydrofluoric acid solution and 2 wt. % of hydrogen peroxide solution is first prepared to immerse the wafer thereinto, the etching of the oxide film produced by the dilute hydrofluoric acid is affected because the mixture contains the hydrogen peroxide solution that oxidizes the silicon wafer. In other words, there may be caused a phenomenon such that the natural oxide film is not completely removed from the silicon surface. Accordingly, when impurities are contained in the natural oxide film, the removal effect may be lowered. For improving the removal effect, the wafer surface may be treated with only the dilute hydrofluoric acid solution to remove the natural oxide film completely. However, the metal impurities such as copper cannot be removed by the dilute hydrofluoric acid solution. This is because copper is reversely adsorbed to the wafer surface. Therefore, for removing such copper from the wafer surface, it is necessary to treat the wafer with the mixture composed of the dilute hydrofluoric acid solution and the hydrogen peroxide solution (or ozone solution) after removing the natural oxide film.

On the contrary, the Example 2 described above according to the invention is different from such cleaning method that the wafer is immersed into the previously prepared mixture composed of the dilute hydrofluoric acid solution and the hydrogen peroxide solution. As shown in FIG. 2B, the wafer is continuously subjected in only the cleaning vessel 12 to the first treatment using the dilute hydrofluoric acid solution (for the total time periods T12 and T13) and the second treatment using the mixture composed of the dilute hydrofluoric acid solution and the hydrogen peroxide solution (for the total time periods T14 and T15). Therefore, the natural oxide film is mainly removed by the first treatment using the dilute hydrofluoric acid solution, and metal impurities such as copper is completely removed from the wafer surface by the second treatment using the mixture of the dilute hydrofluoric acid solution and the hydrogen peroxide solution.

Cleaning effects of the Example 1 will now be described.

FIG. 3 shows an effect of removing copper. In FIG. 3, the ordinate represents the adsorbed amount of copper on the wafer surface.

As a sample for investigating the effects of the Example 1, a wafer on which $2\times10^{13}$ atoms/cm$^2$ of copper is adsorbed before the treatment is employed as shown by a bar I in FIG. 3. In the drawing, a bar II shows the result obtained by subjecting the wafer to the SC-2 treatment, and a bar III shows the result obtained by subjecting the wafer to the treatment of the Example 1.

As is apparent from FIG. 3, the copper adsorbed to the wafer surface is reduced by the SC-2 treatment merely to a level of $8\times10^{12}$ atoms/cm$^2$, whereas it is reduced to a level lower than $1\times10^{11}$ atoms/cm$^2$, i.e., to the detection limit.

For the above measurement, a total internal reflection fluorescent X-ray was used.

FIG. 4 shows an effect of removing particles. In FIG. 4, the ordinate represents the particle removal ratio, and the abscissa represents the number of repeated cleaning cycles. FIG. 4 also shows the particle removal ratio by the SC-1 treatment.

Particles are removed from the wafer surface as shown in FIG. 4. More specifically, each time the cleaning cycle is repeated, the particle removal ratio is increased, and the cleaning effect is improved. As is apparent from FIG. 4, the particle removal ratio of Example 1 is greater than that obtained by the SC-1 treatment after four cleaning cycles.

As described above, according to the present invention, a cleaning fluid is continuously replaced by another in the cleaning vessel, thereby preventing reverse adsorption of particles. For example, as described in the prior art, when the wafer is exposed to the atmosphere during the transfer step for transferring the wafer from the ozone solution to the mixture of the ozone solution and the dilute hydrofluoric acid solution, the particles are increased. More specifically, according to the prior art, about 50 particles each having a diameter of 0.2 μm or more are provided in a 6-inch wafer. On the contrary, 10 or less particles of this size are provided according the treatment of the invention.

FIG. 5 shows an apparatus 10 for treating a surface of a semiconductor wafer according to a second embodiment of the present invention.

In the embodiment, instead of directly supplying the dilute cleaning fluids to the cleaning vessel as in the first embodiment, process fluids each having a high concentration are supplied to a mixer 21 from the first cleaning fluid supply unit 17 and/or the second cleaning fluid supply unit 18 through control valves 192/193, and the dilute cleaning fluid is supplied to the cleaning vessel 12 from the mixer 21 through a supply line 22, thereby treating the wafer 11.

For example, for cleaning the surface of the silicon wafer 11, using 0.2 wt. % of dilute hydrofluoric acid solution and an ozone solution as first and second cleaning fluids in the same manner as in the first embodiment, the deionized water is supplied to the mixer 21 from the deionized water supply unit 16 through the control valve 19, and 49 wt. % of hydrofluoric acid is supplied to the mixer 21 through the control valve 192, thereby producing 0.2 wt. % of dilute hydrofluoric acid solution. The dilute hydrofluoric acid solution is supplied to the cleaning vessel 12. Further, about 5 ppm of ozone solution is supplied to the cleaning vessel 12 from the second cleaning fluid supply unit 18 through the mixer 21.

In the embodiment, the control valves 191 to 193 are controlled so that the relation between the time and the concentration of the cleaning fluids as shown in FIGS. 2A and 2B can be obtained.

According to the embodiment, since the process fluids having the high concentration are supplied to the mixer 21 from the first cleaning fluid supply unit 17 and/or the second cleaning fluid supply unit 18, small reservoirs can be used as the cleaning fluid supply units.

It is further understood by those skilled in the art that the foregoing description is only of the preferred embodiments and that various changes and modifications may be made in the invention without departing from the spirit and scope thereof.

What is claimed is:

1. A method for cleaning a surface of a semiconductor wafer, comprising the steps of:
   cleaning the semiconductor wafer;
   rinsing the semiconductor wafer;
   the cleaning step including the steps of:
      supplying a second solution into a first solution in which the semiconductor wafer is immersed, replacing the first solution with a first mixed solution prepared by mixing the first and second solutions, and treating the semiconductor wafer using the first mixed solution, and
      supplying a third solution into the first mixed solution in which the semiconductor wafer is immersed, replacing the first mixed solution with a second mixed solution prepared by mixing the first mixed solution and the third solution, and treating the semiconductor wafer using the second mixed solution.

2. A semiconductor wafer surface cleaning method according to claim 1, wherein the second solution is a solution for decomposing organic matter adhered to the surface of the semiconductor wafer, and the third solution is a solution for removing a film formed by the second solution from the surface of the semiconductor wafer.

3. A semiconductor wafer surface cleaning method according to claim 2, wherein the second solution contains oxygen and the third solution contains hydrofluoric acid.

4. A semiconductor wafer surface cleaning method according to claim 3, wherein the second solution contains one of ozone and hydrogen peroxide.

5. A semiconductor wafer surface cleaning method according to claim 1, wherein the second solution is a solution for oxidizing the semiconductor wafer, and the third solution is a solution for removing an oxide film covering the surface of the semiconductor wafer.

6. A semiconductor wafer surface cleaning method according to claim 5, wherein the second solution contains oxygen and the third solution contains hydrofluoric acid.

7. A semiconductor wafer surface cleaning method according to claim 6, wherein the second solution contains one of ozone and hydrogen peroxide.

8. A semiconductor wafer surface cleaning method according to claim 1, wherein the second solution is a solution for removing a natural oxide film covering the surface of the semiconductor wafer, and the third solution is a solution for removing materials adhered to the surface of the semiconductor wafer by the second solution.

9. A semiconductor wafer surface cleaning method according to claim 8, wherein the third solution contains oxygen and the second solution contains hydrofluoric acid.

10. A semiconductor wafer surface cleaning method according to claim 9, wherein the third solution contains one of ozone and hydrogen peroxide.

11. A semiconductor wafer surface cleaning method according to claim 1, wherein at least the cleaning step, including the steps of supplying a second solution and supplying a third solution, is repeated.

12. A semiconductor wafer surface cleaning method according to claim 1, wherein a rinsing solution used in the rinsing step is the same solution as the first solution.

13. A semiconductor wafer surface cleaning method according to claim 12, wherein the rinsing solution and the first solution are deionized water.

14. A method for cleaning a surface of a semiconductor wafer, comprising the steps of:
   supplying a second solution into a first solution in which the semiconductor wafer is immersed, replacing the first solution with a first mixed solution prepared by mixing the first and second solutions, and treating the semiconductor wafer using the first mixed solution, and
   supplying a third solution into the first mixed solution in which the semiconductor wafer is immersed, replacing the first mixed solution with a second mixed solution prepared by mixing the first mixed solution and the third solution, and treating the semiconductor wafer using the second mixed solution.

15. A semiconductor wafer surface cleaning method according to claim 14, wherein the second solution is a solution for decomposing organic matter adhered to the surface of the semiconductor wafer, and the third solution is a solution for removing a film formed by the second solution from the surface of the semiconductor wafer.

16. A semiconductor wafer surface cleaning method according to claim 15, wherein the second solution contains oxygen and the third solution contains hydrofluoric acid.

17. A semiconductor wafer surface cleaning method according to claim 16, Wherein the second solution contains one of ozone and hydrogen peroxide.

18. A semiconductor wafer surface cleaning method according to claim 14, wherein the second solution is a solution for oxidizing the semiconductor wafer, and the third solution is a solution for removing an oxide film covering the surface of the semiconductor wafer.

19. A semiconductor wafer surface cleaning method according to claim 18, wherein the second solution contains oxygen and the third solution contains hydrofluoric acid.

20. A semiconductor wafer surface cleaning method according to claim 19, wherein the second solution contains one of ozone and hydrogen peroxide.

21. A semiconductor wafer surface cleaning method according to claim 14, wherein the second solution is a solution for removing a natural oxide film covering the surface of the semiconductor wafer, and the third solution is a solution for removing materials adhered to the surface of the semiconductor wafer by the second solution.

22. A semiconductor wafer surface cleaning method according to claim 21, wherein the second solution contains oxygen and the third solution contains hydrofluoric acid.

23. A semiconductor wafer surface cleaning method according to claim 22, wherein the second solution contains one of ozone and hydrogen peroxide.

24. A method for continuously cleaning a semiconductor wafer by maintaining a cleaning vessel hydraulically full during each process step, comprising the steps of:

supplying deionized water in the cleaning vessel to fill the cleaning vessel with the deionized water;

immersing the semiconductor wafers into the deionized water in the cleaning vessel;

supplying a first solution into the deionized water such that the deionized water overflows the cleaning vessel, thereby replacing the deionized water with a first mixed solution prepared by mixing the deionized water and the first solution;

supplying a second solution into the first mixed solution such that the first mixed solution overflows the cleaning vessel, thereby replacing the first mixed solution with a second mixed solution prepared by mixing the first mixed solution and the second solution;

supplying deionized water into the second mixed solution such that the second mixed solution overflows the cleaning vessel, thereby replacing the second mixed solution with deionized water; and removing the semiconductor wafer from the deionized water in the cleaning vessel.

25. A semiconductor wafer surface cleaning method according to claim 24, wherein the first solution contains ozone.

26. A semiconductor wafer surface cleaning method according to claim 24, wherein the first solution contains hydrofluoric acid.

27. A semiconductor wafer surface cleaning method according to claim 25, wherein the second solution contains hydrofluoric acid.

28. A semiconductor wafer surface cleaning method according to claim 26, wherein the second solution contains hydrogen peroxide.

* * * * *

UNITED STATES PATENT AND TRADEMARK OFFICE
CERTIFICATE OF CORRECTION

PATENT NO. : 5,810,940
DATED : September 22, 1998
INVENTOR(S) : Yuji FUKAZAWA et al.

It is certified that error appears in the above-indentified patent and that said Letters Patent is hereby corrected as shown below:

Claim 7, Col. 8, line 22, "contains-" should read --contains--.

Claim 17, Col. 9, line 2, "Wherein" should read --wherein--.

Signed and Sealed this

Twenty-second Day of June, 1999

Attest:

Attesting Officer

Q. TODD DICKINSON

Acting Commissioner of Patents and Trademarks